United States Patent
Byun et al.

(10) Patent No.: US 11,631,643 B2
(45) Date of Patent: Apr. 18, 2023

(54) SUBSTRATE EMBEDDED ELECTRONIC COMPONENT PACKAGE

(71) Applicant: SAMSUNG ELECTRO-MECHANICS CO., LTD., Suwon-si (KR)

(72) Inventors: Dae Jung Byun, Suwon-si (KR); Chang Hwa Park, Suwon-si (KR); Sang Ho Jeong, Suwon-si (KR); Je Sang Park, Suwon-si (KR); Mi Sun Hwang, Suwon-si (KR); Yong Duk Lee, Suwon-si (KR); Jin Won Lee, Suwon-si (KR); Yeo Il Park, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 322 days.

(21) Appl. No.: 16/814,197

(22) Filed: Mar. 10, 2020

(65) Prior Publication Data
US 2021/0183774 A1  Jun. 17, 2021

(30) Foreign Application Priority Data
Dec. 17, 2019 (KR) .................. 10-2019-0168944

(51) Int. Cl.
| | | |
|---|---|---|
| *H01L 23/538* | (2006.01) | |
| *H01L 23/31* | (2006.01) | |
| *H01L 23/522* | (2006.01) | |
| *H01L 23/13* | (2006.01) | |
| *H01L 23/498* | (2006.01) | |

(Continued)

(52) U.S. Cl.
CPC ...... *H01L 23/5384* (2013.01); *H01L 23/3157* (2013.01); *H01L 23/5227* (2013.01); *H01L 23/5386* (2013.01); *H01L 25/0655* (2013.01)

(58) Field of Classification Search
CPC ................ H01L 23/3157; H01L 5227/5386
See application file for complete search history.

(56) References Cited

U.S. PATENT DOCUMENTS

2016/0120025 A1* 4/2016 Kim ............... H05K 1/0218
                                                    174/257
2016/0233167 A1* 8/2016 Shimizu ......... H01L 23/5389
(Continued)

FOREIGN PATENT DOCUMENTS

| KR | 10-0494463 B1 | 6/2005 |
| KR | 10-2013-0032529 A | 9/2011 |
| KR | 10-2017-0084893 A | 7/2017 |

*Primary Examiner* — Omar F Mojaddedi
(74) *Attorney, Agent, or Firm* — Morgan, Lewis & Bockius LLP

(57) ABSTRACT

A substrate embedded electronic component package includes a core member having a cavity in which a metal layer is disposed on a bottom surface thereof, an electronic component disposed in the cavity, an encapsulant filling at least a portion of the cavity and covering at least a portion of each of the core member and the electronic component, and a connection structure disposed on the encapsulant and including a first wiring layer connected to the electronic component. A wall surface of the cavity has at least one groove portion protruding outwardly from a center of the cavity, and the groove portion extends to a same depth in the core member as a depth of the cavity.

15 Claims, 8 Drawing Sheets

(51) Int. Cl.
*H01L 25/065* (2006.01)
*H05K 1/11* (2006.01)
*H05K 3/46* (2006.01)

(56) References Cited

U.S. PATENT DOCUMENTS

2016/0322294 A1* 11/2016 Kobayashi ........ H01L 23/49827
2021/0045242 A1* 2/2021 Tanaka ................. H05K 3/4682
2021/0159211 A1* 5/2021 Rubin ................. H01L 23/5385

* cited by examiner

II-II'

I-I'

SUBSTRATE EMBEDDED ELECTRONIC COMPONENT PACKAGE

CROSS-REFERENCE TO RELATED APPLICATION(S)

This application claims benefit of priority to Korean Patent Application No. 10-2019-0168944 filed on Dec. 17, 2019 in the Korean Intellectual Property Office, the disclosure of which is incorporated herein by reference in its entirety.

BACKGROUND

The present disclosure relates to a substrate embedded electronic component package.

In recent years, an electronic component has been required to have not only high performance but also miniaturization and thinning of a size thereof. Accordingly, a technology for a substrate embedded electronic component package in which an electronic component such as a passive element, an active element, and the like are embedded in a printed circuit board has been developed.

Meanwhile, when the electronic component is embedded therein, there may be a case in which damages such as cracking, breakages, or the like, occur in the electronic component due to collisions with a substrate in which the electronic component is embedded, which need to be improved.

SUMMARY

An aspect of the present disclosure is to provide a substrate embedded electronic component package reducing a possibility of damage to electronic components that may occur when the electronic components are embedded therein.

According to an aspect of the present disclosure, a substrate embedded electronic component package includes a core member having a cavity in which a metal layer is disposed on a bottom surface thereof, an electronic component disposed in the cavity, an encapsulant filling at least a portion of the cavity and covering at least a portion of each of the core member and the electronic component, and a connection structure disposed on the encapsulant and including a first wiring layer connected to the electronic component. A wall surface of the cavity has at least one groove portion protruding outwardly from a center of the cavity, and the groove portion extends to a same depth in the core member as a depth of the cavity.

According to another aspect of the present disclosure, a substrate embedded electronic component package includes a core member having a cavity and including a plurality of first wiring layers, an electronic component disposed in the cavity, an encapsulant covering at least a portion of a side wall of each of the cavity and the electronic component, and a connection structure disposed on the encapsulant and including a second wiring layer connected to the electronic component. A wall surface of the cavity has at least one groove portion protruding outwardly from a center of the cavity, the groove portion extends to a same depth in the core member as a depth of the cavity, and the groove portion penetrates at least a portion of a first wiring layer disposed on an uppermost side of the plurality of first wiring layers.

According to a further aspect of the present disclosure, a substrate embedded electronic component package includes a core member having a cavity in which a planar metal layer is disposed on a bottom surface thereof, and a plurality of first wiring layers disposed in the core member and on the top surface of the core member. The cavity comprises a cavity main portion having a quadrangular shape that is tapered to narrow from a top surface of the core member towards the bottom surface of the cavity, and a cavity groove portion protruding outwardly from a corner of the cavity main portion, and at least one wiring layer of the plurality of first layers extends to an edge of the cavity main portion and an edge of the cavity groove portion on the top surface of the core member.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
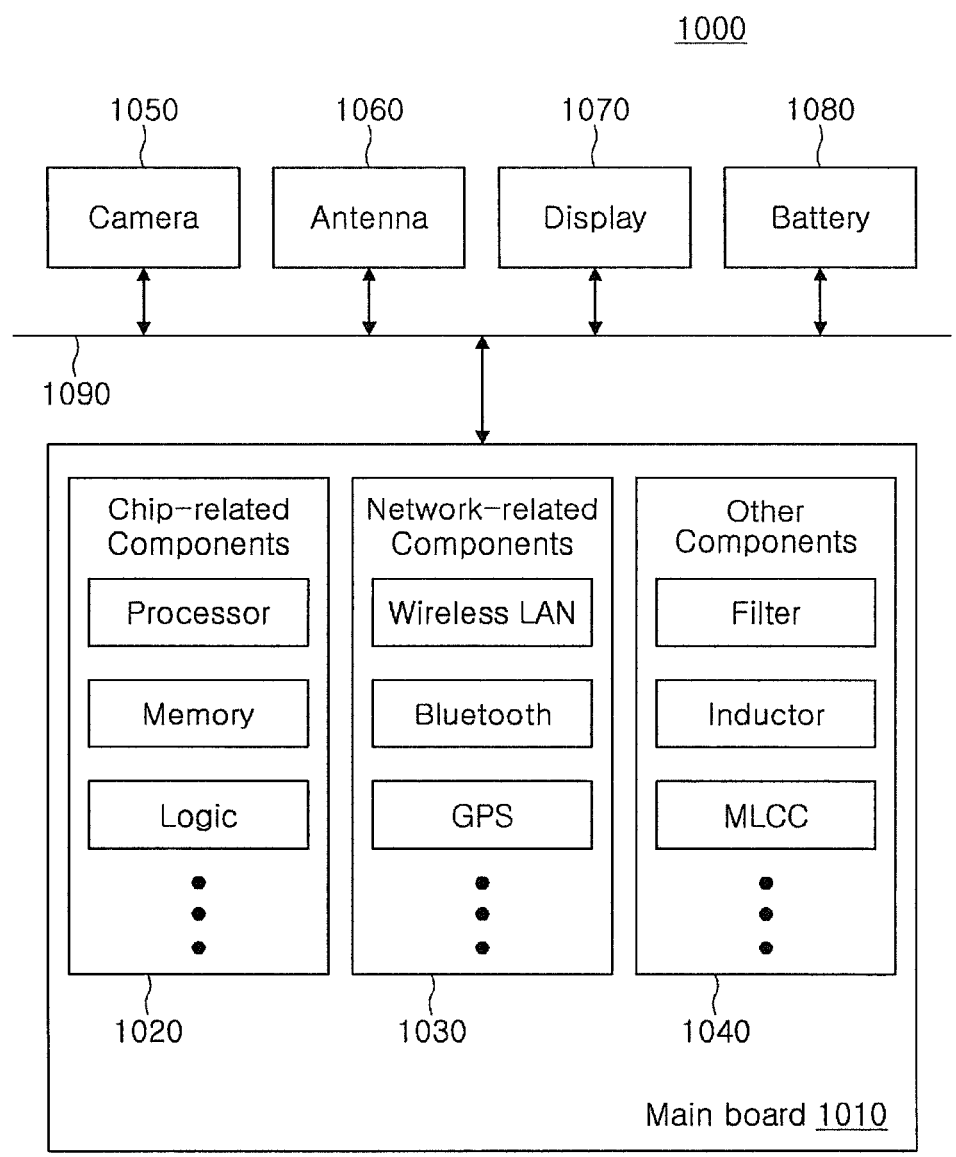
FIG. 1 is a schematic view illustrating a block diagram of an electronic device system according to an example.

Hereinafter, embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include components compatible with or implementing various protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or implementing a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
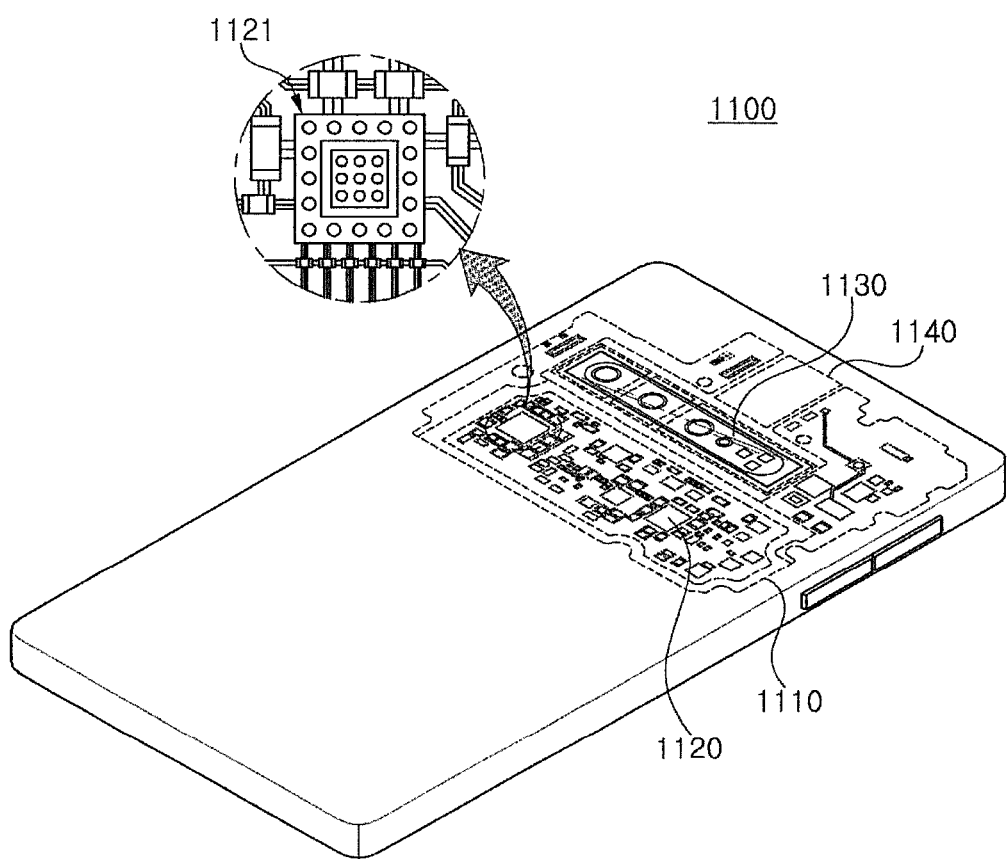
FIG. 2 is a schematic perspective view illustrating an electronic device according to an example.

FIG. 2 is a schematic perspective diagram illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Substrate Embedded Electronic Component Package

Figure 3:
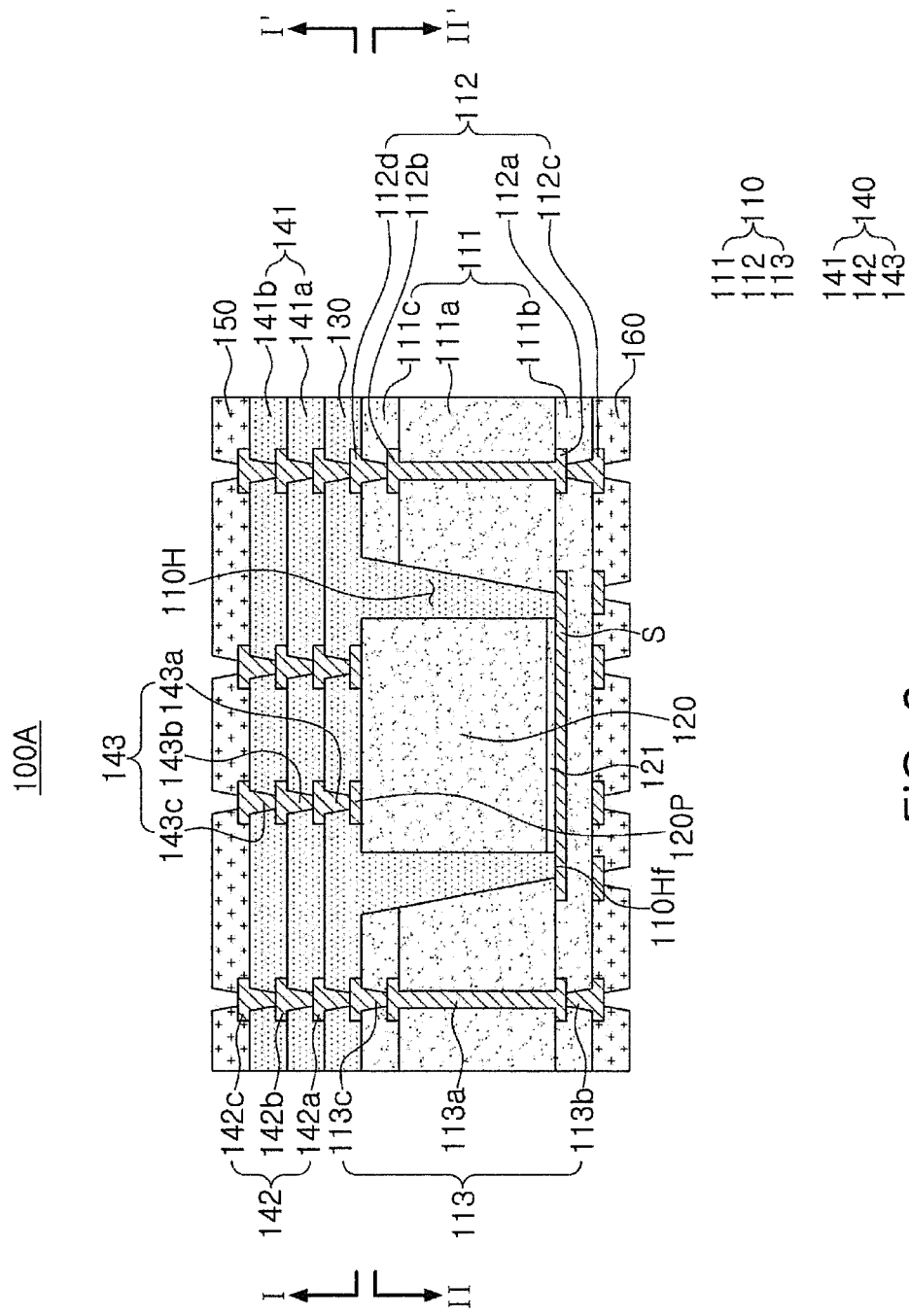
FIG. 3 is a schematic cross-sectional view of a substrate embedded electronic component package 100A according to an example.

FIG. 3 is a schematic cross-sectional view of a substrate embedded electronic component package 100A according to an example.

Figure 4:
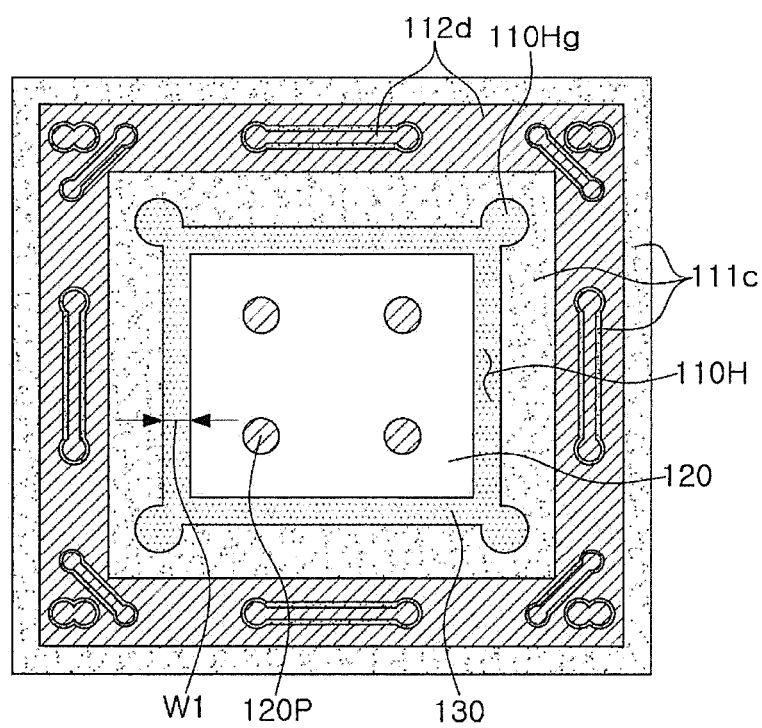
FIG. 4 is a schematic cut plan view of the I-I' surface of the substrate embedded electronic component package of FIG. 3.

FIG. 4 is a schematic cut plan view of the I-I' surface of the substrate embedded electronic component package of FIG. 3.

Figure 5:
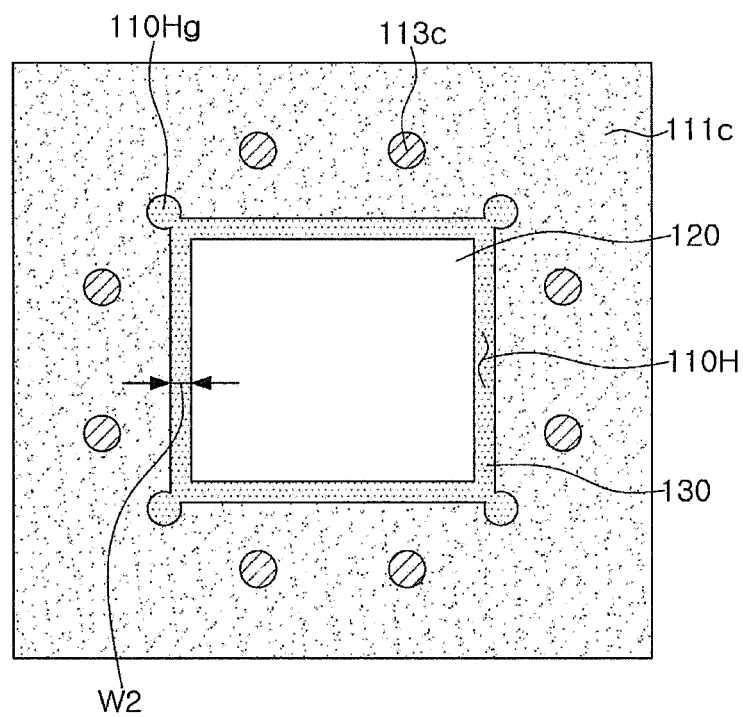
FIG. 5 is a schematic cut plan view of the II-II' surface of the substrate embedded electronic component package of FIG. 3.

FIG. 5 is a schematic cut plan view of the II-II' surface of the substrate embedded electronic component package of FIG. 3.

Referring to FIGS. 3 to 5, a substrate embedded electronic component package 100A according to an example may include: a core member 110 having a cavity 110H in which a metal layer S is disposed on a bottom surface 110Hf thereof; an electronic component 120 disposed in the cavity 110H; an encapsulant 130 filling at least a portion of the cavity 110H, and covering at least a portion of each of the core member 110 and the electronic component 120; and a connection structure 140 disposed on the encapsulant 130. A wall surface of the cavity 110H may have at least one groove portion 110Hg protruding outwardly. More specifically, the groove portion 110Hg may extend from the bottom surface 110Hf of the cavity 110H to a side, opposite to the bottom surface 110Hf, and is formed in a region proximate to which a corner of the electronic component 120 is disposed.

In addition, the substrate embedded electronic component package 100A according to an example may include a first passivation layer 150 disposed on a connection member 140 and a second passivation layer 160 disposed on the core member 110.

In the present specification, a meaning of being disposed on a component is not limited to a direction of being disposed on an upper side or an upper surface of the component. In some cases, it may be a case disposed on a lower side or a lower surface of the component.

The electronic component 120 may be disposed in the cavity 110H of the core member 110 to as to be disposed on the metal layer S. In addition, the substrate embedded electronic component package 100A according to an example may further include an adhesive member 121, and the electronic component 120 may be disposed and adhered on the metal layer S through the adhesive member 121. In this case, the adhesive member 121 may be disposed between the electronic component 120 and the metal layer S.

The electronic component 120 may have a die having a first surface having a connection pad 120P and a second surface, opposite to the first surface, as described below. In this case, the first surface having the connection pad 120P is disposed in a face-up manner to face each of the connection structure 140. Therefore, the connection pad 120P may be connected to the wiring layer 142 of the connection structure 140.

Meanwhile, when the electronic component 120 is mounted in the cavity 110H, damage such as cracking or breakage to electronic components due to collisions between corners of the electronic component 120 and a side surface of the cavity 110H may occur. As the substrate embedded electronic component package 100A according to an example, when it has a groove portion 110Hg in which the wall surface of the cavity 110H protrudes outwardly from the cavity in a region in which (or proximate to where) the corner of the electronic component 120 is disposed, a free space may be secured in the region in which the corner of the electronic component 120 is disposed. Therefore, damage such as cracking, breakages, or the like to the electronic component due to collisions between the corner of the electronic component 120 and the wall surface of the cavity 110H may be reduced.

The cavity 110H may be formed by a method such as sandblasting, laser processing, or the like. In this case, the metal layer S disposed on the bottom surface 110Hf of the cavity 110H may serve as a stopper layer when the cavity 110H is processed. In order to perform such a role, the metal layer S may be made of a material having a lower etching rate than that of each of the insulating layers 111a to 111c of the core member 110. Therefore, the metal layer S may serve as a polishing stop layer or a processing stop layer when the cavity 110H is processed.

In addition, the cavity 110H may have a shape in which a width thereof is increased from one side in which the metal layer S of the core member 110 is disposed to the other side, opposite to the one side according to a processing method. That is, the cavity 110H may have a tapered shape in which a width thereof is widened from a bottom thereof (adjacent to the metal layer S) towards a top thereof opposite to the bottom. Meanwhile, the groove portion 110Hg may extend to the full depth of the cavity 110H from Sidebottom of the cavity to the top thereof, and may be formed on the wall surface of the cavity 110H. In this case, the groove portion 110Hg formed on the wall surface of the cavity 110H may also have a shape in which a width thereof is widened from a bottom thereof to the top thereof. In addition, referring to FIGS. 4 and 5, an interval between the wall surface of the cavity 110H and the electronic component 120 is different according to a measurement level, specifically, W1 is larger than W2. That is, as the width of the cavity 110H changes, the interval between the wall surface of the cavity 110H and the electronic component 120 may also increase from a bottom towards a top of the cavity 110H in the core member.

As described later, the core member 110 may include a plurality of insulating layers 111a to 111c and a plurality of wiring layers 112a to 112d, and an outer circumference of the cavity 110H and the groove portion 110Hg may be physically spaced apart from a fourth wiring layer 112d disposed on a plane on an uppermost side of the plurality of wiring layers 112a to 112d. Here, the outer circumference may mean an outer circumference or an outer edge. In addition, a third insulating layer 111c disposed on an uppermost side of the plurality of insulating layers 111a to 111c may be disposed between the cavity 110H and the fourth wiring layer 112d on a plane. Similarly thereto, a third insulating layer 111c disposed on an uppermost side of the plurality of insulating layers 111a to 111c may be disposed between the groove portion 110Hg and the fourth wiring layer 112d on a plane.

The metal layer S may be a portion of the first wiring layer 112a as described later. That is, the metal layer S may have a metal pattern formed together with a wiring pattern of the wiring layer 112a disposed on the same level. Therefore, levels of each of one surface and the other surface of the metal layer S and levels of each of one surface and the other surface of the first wiring layer 112a may be substantially the same. In addition, the thickness of the metal layer S and the thickness of the first wiring layer 112a may also be substantially the same. In the present specification, being substantially the same is meant to include not only being exactly the same but also an error range allowable at a level of a person skilled in the art.

Meanwhile, the bottom surface 110Hf of the cavity 110H does not necessarily mean a flat surface, but means to include an inclined or curved surface. Meanwhile, the bottom surface 110Hf may be a portion that is substantially deepest in the cavity 110H. However, when the cavity 110H has an inclined or curved shape, a depth of the cavity 110H may not be the same for each measurement point.

The encapsulant 130 may cover at least a portion each of the core member 110 and the electronic component 120, and may fill at least a portion of each of the cavity 110H and the groove portion 110Hg. For example, the encapsulant 130 may cover at least a portion of each of a side wall of the cavity 110H and the electronic component 120, and may fill at least a portion of a space between the side wall of the cavity 110H and the electronic component 120. Therefore, the electronic component 120 may be spaced apart from the side wall of the cavity 110H by the encapsulant 130 by a predetermined distance. In addition, the encapsulant 130 may cover at least a portion of one surface (e.g., a top surface) of the core member 110.

Hereinafter, each configuration of the substrate embedded electronic component package 100A according to an example will be described in more detail.

The core member 110 may include a first insulating layer 111a, a first wiring layer 112a and a metal layer S disposed on one surface of the first insulating layer, a second wiring layer 112b disposed on another surface of the first insulating layer 111a (e.g., a surface opposite to the one surface), a first via 113a penetrating the first insulating layer 111a and connecting the first wiring layer 112a and the second wiring layer 112b, a second insulating layer 111b disposed on the one surface of the first insulating layer 111a and covering the first wiring layer 112a and the metal layer S, a third wiring layer 112c disposed on one surface (e.g., a bottom surface) of the second insulating layer 111b, a second via 113b penetrating the second insulating layer 111b and connecting the first wiring layer 112a and the third wiring layer 112c, a third insulating layer 111c disposed on the other surface of the first insulating layer 111a and covering the second wiring layer 112b, a fourth wiring layer 112d disposed on the other surface of the third insulating layer 111c, and a third via 113c penetrating the third insulating layer 111c and connecting the second wiring layer 112b and the fourth wiring layer 112d.

However, a structure of the core member 110 is not limited thereto, and may be changed as much as possible within a range that can be designed by those skilled in the art. For example, the number of insulating layers, wiring layers, and/or vias included in the core member 110 may be more or less than shown in the drawings.

The core member 110 has a cavity 110H in which the metal layer S is disposed on the bottom surface 110Hf thereof.

The cavity 110H may be formed by a sand blast method using abrasive particles, a dry etching method using plasma, a mechanical drilling and/or a laser drilling method, or the like.

As described above, the metal layer S may be a portion of the first wiring layer 112a. That is, the metal layer S may be a metal pattern formed together with a wiring pattern of the wiring layer 112a disposed on the same level. Therefore, levels of each of one surface and an opposing other surface of the metal layer S and levels of each of one surface and an opposing other surface of the first wiring layer 112a may be substantially the same as each other. In addition, the thickness of the metal layer S and the thickness of the first wiring layer 112a may also be substantially the same.

At least a portion of the third wiring layer 112c may be disposed on one surface of the metal layer S to overlap with the metal layer S. As described later, the third wiring layer 112c may include a ground (GND) pattern, a power (PWR) pattern, a signal (S) pattern, and the like, and the at least a portion of the third wiring layer 112c may be disposed on one surface of the metal layer S.

The thickness of the first insulating layer 111a may be greater than the thicknesses of each of the second insulating layer 111b and the third insulating layer 111c. Therefore, rigidity of an entire substrate may be maintained, and may be advantageous for warpage control. The thicknesses of each of the second insulating layer 111b and the third insulating layer 111c may be the same as each other, or different from each other.

A formation material of each of the first to third insulating layers 111a to 111c is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imageable Dielectric (PID) resin may be used.

As a formation material of each of the first to fourth wiring layers 112a to 112d, a conductive material such as copper (Cu), aluminum (Al), silver (Ag), tin (Sn), gold (Au), nickel (Ni), lead (Pb), titanium (Ti), or alloys thereof may be used. Each of the first to fourth wiring layers 112a to 112d may perform various functions depending on designs. For example, each of the first to fourth wiring layers 112a to 112d may include a ground (GND) pattern, a power (PWR) pattern, a signal (S) pattern, and the like. Here, the signal(S) pattern may include various signals except for the ground (GND) pattern, the power (PWR) pattern, and the like, such as data signals, and the like. In addition, patterns and/or pads included in each of the first to fourth wiring layers 112a to 112d may have a plate shape as well as a patterned shape. For example, they may include a ground (GND) plate.

The metal layer S may be formed of a material having an etching late, lower than that of each of the first to third insulating layers 111a to 111c of the core member 110. For example, the metal layer S may include a metal such as copper (Cu). However, the metal layer S is not limited to the metal, and may include an insulating material. For example, the metal layer S may include a photosensitive polymer such as a dry film photoresist (DFR).

As a formation material of each of the first to third vias 113a to 113c, a conductive material such as copper (Cu), aluminum (Al), silver (Ag), tin (Sn), gold (Au), nickel (Ni), lead (Pb), titanium (Ti), or alloys thereof may be used. Each of the first to third vias 113a to 113c may be formed by completely filling a via hole with a conductive material, or the conductive material may be formed along a wall of the via hole. When the via is formed as a conductive material along the wall of the via hole, an inside of the via hole may be filled with an insulating material. In addition, shapes of the first to third vias 113a to 113c may have all shapes known in the art, such as a tapered shape, a cylindrical shape, and the like.

The electronic component 120 may be a passive component such as a multi-layer ceramic capacitor (MLCC), a power inductor (PI), or the like, and/or an active component such as an integrated circuit (IC) or a die. For example, as described above, the electronic component 120 may be a die having a connection pad 120P, and may be disposed in a face-up manner.

An adhesive member 121 may be used as long as it can fix the electronic component 120, and as a non-limiting example, a known tape, a die attach film (DAF), or the like, may be used.

A formation material of the encapsulant 130 is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imageable Dielectric (PID) resin may be used.

A boundary between the encapsulant 130 and an insulating layer 141a of a connection member 140, in contact with the encapsulant 130 may not be distinguished from each other according to materials and processes of each of the encapsulant 130 and the insulating layer 141a. That is, during a lamination process, the encapsulant 130 and the insulating layer 141a of the connection member 130 may be integrated with each other or a boundary therebetween may be unclear, such that it may be difficult to visually check the boundary therebetween with a naked eye in a structure of the substrate embedded electronic component package, which is completed.

The connection structure 140 may include a first wiring layer 142a disposed on the encapsulant 130, a first via 143a penetrating the encapsulant 130 and connecting the first wiring layer 142a to the electronic component 120 or the wiring layer 112d of the core member 110, a first insulating layer 141a disposed on the encapsulant 130 and covering the first wiring layer 142a, second wiring layer 142b disposed on the first insulating layer 141a, a second via 143b penetrating the first insulating layer 141a and connecting the first wiring layer 142a and the second wiring layer 142b, a second insulating layer 141b disposed on the first insulating layer 142a and covering the second wiring layer 142b, a third wiring layer 142c disposed on the second insulating layer 141b, and a third via 143c penetrating the second insulating layer 141b and connecting the second wiring layer 142b and the third wiring layer 142c.

However, a structure of the connection structure 140 is not limited thereto, and may be changed as much as possible within a range able to be conceived of by those skilled in the art. For example, the number of insulating layers, wiring layers, and/or vias included in the connection structure 140 may be more or less than shown in the drawings.

A formation material of each of the first to second insulating layers 141a to 141b is not particularly limited, and any material may be used as long as it has insulating properties. For example, a thermosetting resin such as an epoxy resin, a thermoplastic resin such as a polyimide, or a resin in which these resins are impregnated with a core such as glass cloth or glass fabric together with an inorganic filler, for example, a prepreg, Ajinomoto Build-up Film (ABF), FR-4, Bismaleimide Triazine (BT), and the like can be used. If necessary, a Photo Imageable Dielectric (PID) resin may be used.

As described above, a boundary between an insulating layer 141a of a connection member 140 and the encapsulant 130, in contact with the insulating layer 141a of the connection member 140 may not be distinguished from each other according to materials of each of the encapsulant 130 and the insulating layer 141a and processes of forming the encapsulant 130 and the insulating layer 141a. That is, during the lamination process, the encapsulant 130 and the insulating layer 141a of the connection member 140 may be integrated with each other such that a boundary therebetween may be unclear, and such that it may be difficult to visually determine the boundary therebetween with a naked eye in a structure of the substrate embedded electronic component package, which is completed.

In addition, a boundary between the first to second insulating layers 141a to 141b may also not be distinguished from each other according to materials and processes of each of the first to second insulating layers 141a to 141b. That is, during the lamination process, the first to second insulating layers 141a to 141b may be integrated with each other or a boundary therebetween may be unclear, such that it may be difficult to visually check the boundary therebetween with a naked eye in a structure of the substrate embedded electronic component package, which is completed. In some cases, only a portion of the first to second insulating layers 141a to 141b may have a boundary.

As a formation material of each of the first to third wiring layers 142a to 142c, a conductive material copper (Cu), aluminum (Al), silver (Ag), tin (Sn), gold (Au), nickel (Ni), lead (Pb), titanium (Ti), or alloys thereof may be used. Each of the first to third wiring layers 142a to 142c may perform various functions depending on designs. For example, each of the first to third wiring layers 142a to 142c may include a ground (GND) pattern, a power (PWR) pattern, a signal(S) pattern, and the like. Here, the signal (S) pattern may include various signals except for the ground (GND) pattern, the power (PWR) pattern, and the like, such as data signals, and the like. In addition, a via pad, or the like may be included.

As a formation material of each of the first to third vias 143a to 143c, a conductive material copper (Cu), aluminum (Al), silver (Ag), tin (Sn), gold (Au), nickel (Ni), lead (Pb), titanium (Ti), or alloys thereof may be used. Each of the first to third vias 143a to 143c may be completely filled with a conductive material, or the conductive material may be formed along a wall of a via. When the via is formed as a conductive material along a wall of a via hole, an inside of the via hole may be filled with an insulating material. In addition, shapes of the first to third vias 143a to 143c may be all shapes known in the art, such as a tapered shape, a cylindrical shape, and the like.

The first to second passivation layers 150 and 160 may protect an internal configuration of the substrate embedded electronic component package 100A according to an example from external physical and chemical damages, or the like. Each of the first to second passivation layers 150 and 160 may include a thermosetting resin and an inorganic filler. For example, the first to second passivation layers 150 and 160 may be ABFs, respectively, but the disclosure is not limited thereto, and the first to second passivation layers 150 and 160 may be known photosensitive insulating layers, for example solder resist (SR) layers, respectively. The first to second passivation layers 150 and 160 may include the same kind of material as each other, and may have substantially the same thickness as each other. However, the present disclosure is not limited thereto, and the passivation layers may include different kinds of materials and/or may have different thicknesses from each other.

The first passivation layer 150 may have one or more openings (not shown) exposing at least a portion of a wiring layer 142c disposed on an uppermost side of the wiring layers 142a to 142c of the connection structure 140. In addition, the second passivation layer 160 may have one or more openings (not shown) exposing at least a portion of the wiring layer 112c disposed on a lowermost side of the wiring layers 112a to 112d of the core member 110. In this case, a surface treatment layer may be formed on a surface of each of the exposed wiring layers 142c and 112c. The surface treatment layer may be formed by, for example, gold plating, tin plating, silver plating, nickel plating, or the like. If desired, the openings of each of the first to second passivation layers 150 and 160 may include a plurality of via holes.

Figure 6:
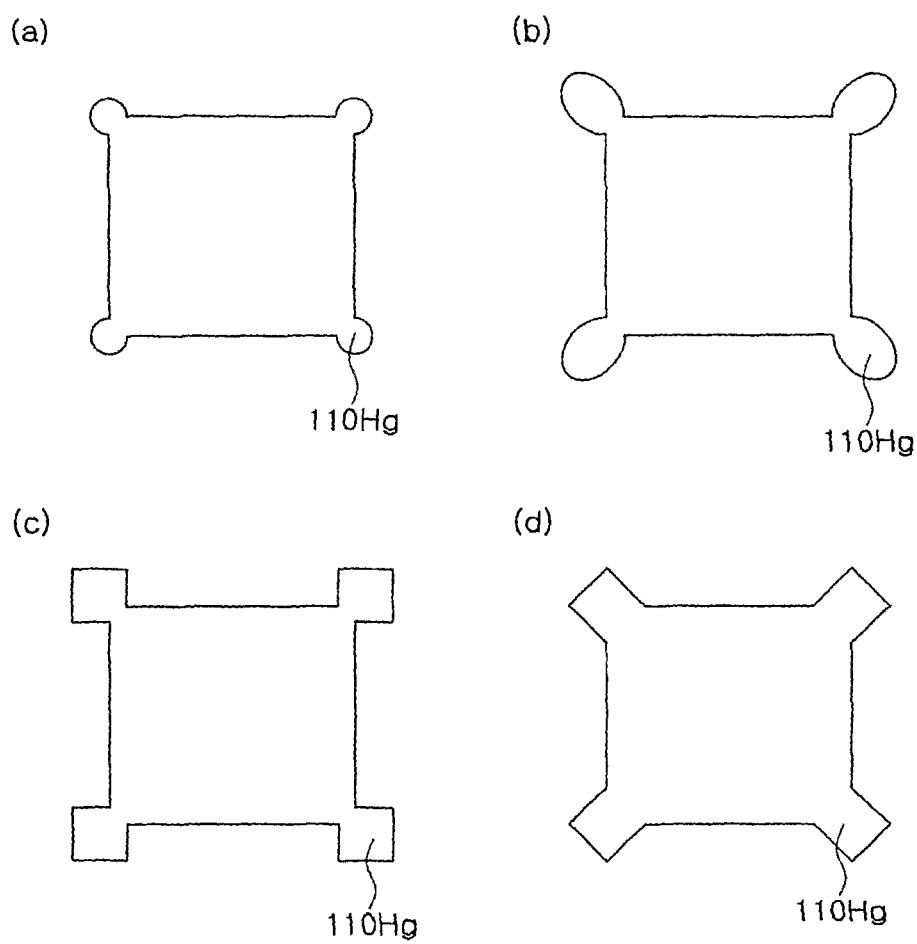
FIG. 6 is a view illustrating shapes for a groove portion of the substrate embedded electronic component package 100A according to various examples.

FIG. 6 illustrates plan views of various shapes that the groove portion 110Hg of the substrate embedded electronic component package 100A according to an example may have as an example.

The groove portion 110Hg may have various shapes. For example, as shown in the drawings, the groove portion 110Hg may have a shape of a circle, an ellipse, a polygon, or the like. The polygon is meant to include both a case of polygons having sides forming a right angle, sides forming an obtuse angle, and/or sides forming an acute angle. For example, the groove portion 110Hg may have shapes such as, triangles, squares, rectangles, rhombuses, diamonds, pentagons, hexagons, heptagons, octagons, and the like, but is not limited thereto. That is, the shape of the groove portion 110Hg is not particularly limited, and may be modified by a person skilled in the art according to the design.

The groove portion 110Hg may have a shape and disposition in which a wall surface of the cavity 110H extends outwardly from a region in which a corner of the electronic component 120 is disposed. Therefore, by securing a free space in the region in which the corner of the electronic component 120 is disposed, it is also possible to secure a distance between the electronic component 120 to be mounted and the wall surface of the cavity 110H and of the groove portion 110Hg. In addition, a distance from the electronic component 120 to an outermost side to the wall surface of the groove portion 110Hg on a plane may be a longest distance among distances from the electronic component 120 to an outermost side to the wall surface of the cavity 110H. That is, a point having the longest distance among the distances from the electronic component 120 to the outermost side to the wall surface of the cavity 110H may be a region having groove portion 110Hg.

The groove portion 110Hg may be a plurality of groove portions 110Hg, and shapes of each of the plurality of groove portions 110Hg may not be the same. For example, a portion of the groove portion 110Hg may have a circular shape, and the other portion of the groove portion 110Hg may have a rectangular shape, but is not limited thereto.

Figure 7:
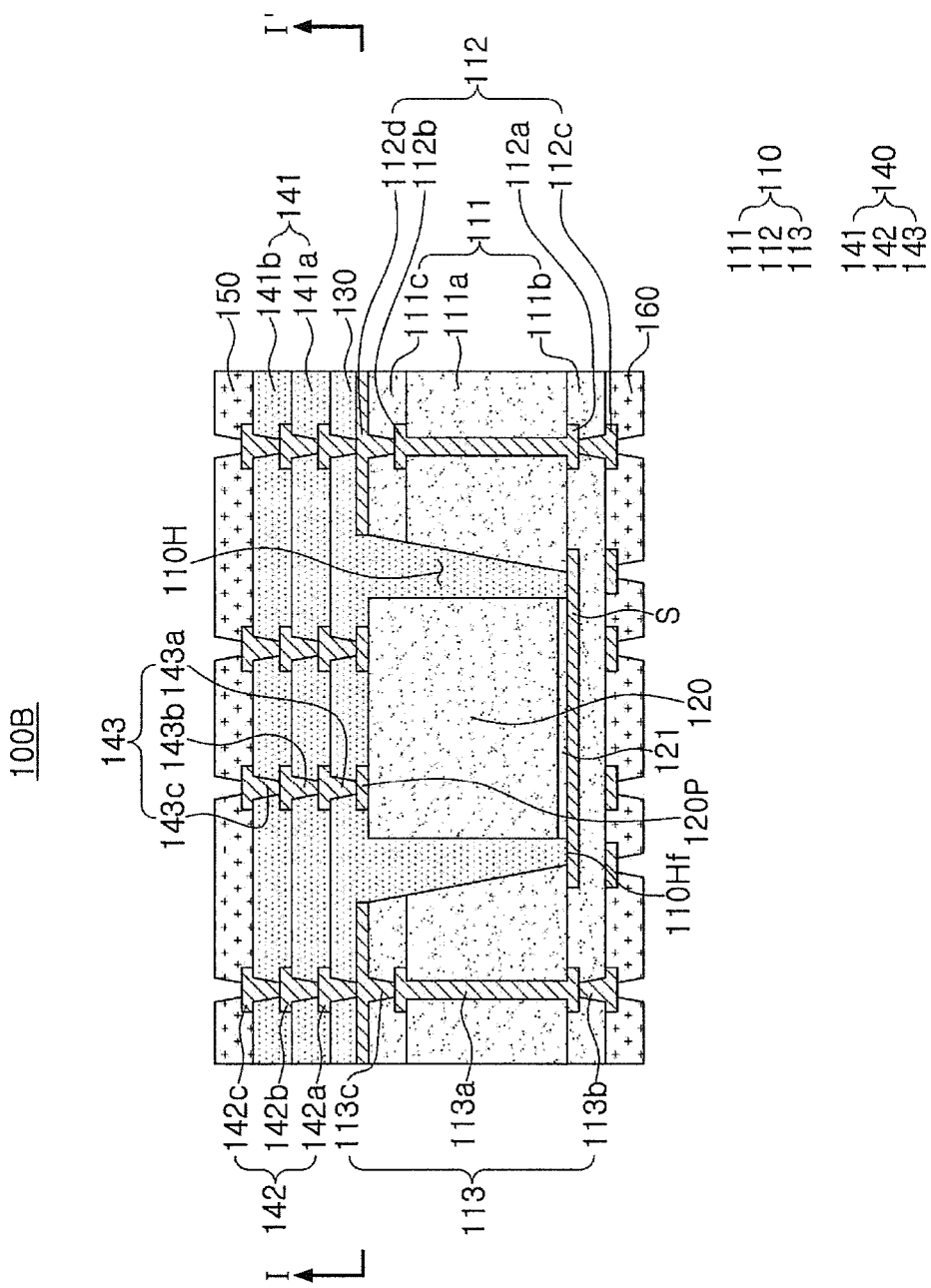
FIG. 7 is a schematic cross-sectional view illustrating a substrate embedded electronic component package 100B according to another example.

FIG. 7 is a schematic cross-sectional view of a substrate embedded electronic component package 100B according to another example.

Figure 8:
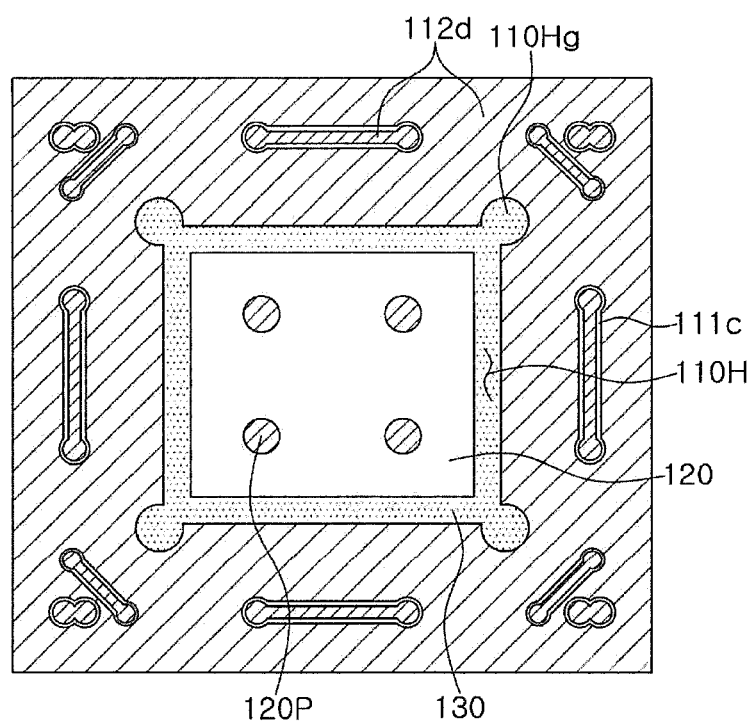
FIG. 8 is a schematic cut plan view of the I-I' surface of the substrate embedded electronic component package of FIG. 7.

FIG. 8 is a schematic cut plan view of I-I' surface of the substrate embedded electronic component package of FIG. 7.

In a substrate embedded electronic component package 100B according to another example, the cavity 110H and the groove portion 110Hg may penetrate at least a portion of the wiring layer 112d disposed on an uppermost side of the wiring layers of the core member 110. Therefore, an outer circumference of each of the cavity 110H and the groove portion 110Hg may be physically in contact with the wiring layer 112d disposed on the uppermost side of the wiring layers of the core member 110 on a plane.

Meanwhile, when the cavity 110H is formed on the core member 110 by a laser drill, laser processing may be performed on one surface on which the metal layer S of the core member 110 is disposed. In addition, after the cavity 110H is formed, the wiring layer 112d disposed on the uppermost side of the wiring layers of the core member 110 may be formed through a process such as a separate patterning, or the like, on a metal layer (not shown).

More specifically, before the cavity 110H of the core member 110 and the fourth wiring layer 112d are formed, a case including the first insulating layer 111a, the first wiring layer 112a and the metal layer S, the second wiring layer 112b, the second insulating layer 111b, the third wiring layer 112c, the third insulating layer 111c, and a metal layer (not shown) disposed on the third insulating layer 111c is prepared may be considered. The cavity 110H may be formed by performing laser processing on one surface of the core member 110. In this case, the metal layer S may serve as a laser processing stop layer as described above. Therefore, as the substrate embedded electronic component package 100B according to another example, the fourth wiring layer 112d may be disposed along a circumference of the cavity 110H by being processed together when (e.g., after) the cavity 110H is formed.

Other contents are substantially the same as described in the substrate embedded electronic component package 100A according to an example, such that detailed description thereof will be omitted.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented and do not exclude the possibilities of combination with features of other example embodiments. For example, even though the features described in one example embodiment are not described in another example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

As set forth above, according to the present disclosure, a substrate embedded electronic component package reducing a possibility of damage to electronic components that may occur when electronic components are embedded therein may be provided.

While the example embodiments have been shown and described above, it will be apparent to those skilled in the art that modifications and variations could be made without departing from the scope of the present invention as defined by the appended claims.

What is claimed is:

1. A substrate embedded electronic component package, comprising:
a core member having a cavity in which a metal layer is disposed on a bottom surface thereof;
an electronic component disposed in the cavity in a mounting direction;
an encapsulant filling at least a portion of the cavity, and covering at least a portion of each of the core member and the electronic component; and
a connection structure disposed on the encapsulant, and including a first wiring layer connected to the electronic component,
wherein a wall surface of the cavity has at least one groove portion protruding outwardly from a center of the cavity in a direction perpendicular to the mounting direction, and the groove portion extends to a same depth in the core member as a depth of the cavity.

2. The substrate embedded electronic component package of claim 1, wherein the groove portion is formed in a region adjacent to a corner of the electronic component.

3. The substrate embedded electronic component package of claim 1, wherein the groove portion has a shape of a circle, an ellipse, or a polygon.

4. The substrate embedded electronic component package of claim 1, wherein the electronic component comprises a die having a first surface having a connection pad and a second surface opposite to the first surface, and
the die is disposed such that the second surface of the die faces the metal layer.

5. The substrate embedded electronic component package of claim 4, wherein the second surface of the die is adhered to the metal layer by an adhesive member.

6. The substrate embedded electronic component package of claim 1, wherein the encapsulant fills at least a portion of each of the cavity and the groove portion.

7. The substrate embedded electronic component package of claim 1, wherein the core member comprises a plurality of insulating layers and a plurality of second wiring layers, and
an outer circumference of the groove portion is physically spaced apart from a second wiring layer disposed on an uppermost side of the plurality of second wiring layers.

8. The substrate embedded electronic component package of claim 1, wherein the core member comprises a plurality of insulating layers and a plurality of second wiring layers, and
a second wiring layer disposed on the uppermost side of the plurality of second wiring layers extends to an edge of the groove portion.

9. The substrate embedded electronic component package of claim 8, wherein an entire outer circumference of the groove portion is in a physical contact with the second wiring layer disposed on the uppermost side of the plurality of second wiring layers.

10. The substrate embedded electronic component package of claim 1, wherein the cavity has a width that is increased from the bottom surface thereof towards a top of the cavity.

11. The substrate embedded electronic component package of claim 1, wherein the core member comprises a first insulating layer, a second wiring layer disposed on one surface of the first insulating layer, a third wiring layer disposed on another surface of the first insulating layer, and a first via penetrating through the first insulating layer and connecting the second wiring layer and the third wiring layer, and the metal layer is disposed on the one surface of the first insulating layer.

12. The substrate embedded electronic component package of claim 11, wherein a thickness of the second wiring layer and a thickness of the metal layer are the same.

13. The substrate embedded electronic component package of claim 11, wherein the core member further comprises a second insulating layer disposed on the one surface of the first insulating layer and covering the second wiring layer and the metal layer, a fourth wiring layer disposed on a surface of the second insulating layer, and a second via penetrating through the second insulating layer and connecting the second wiring layer and the fourth wiring layer, and at least a portion of the fourth wiring layer is arranged to overlap the metal layer in the mounting direction.

14. The substrate embedded electronic component package of claim 13, wherein the core member further comprises a third insulating layer disposed on the other surface of the first insulating layer and covering the third wiring layer, a fifth wiring layer disposed on a surface of the third insulating layer, and a third via penetrating through the third insulating layer and connecting the third wiring layer and the fifth wiring layer.

15. The substrate embedded electronic component package of claim 14, wherein a thickness of the first insulating layer is greater than thicknesses of each of the second insulating layer and the third insulating layer.

* * * * *